United States Patent
Luoh et al.

(10) Patent No.: US 9,006,003 B1
(45) Date of Patent: Apr. 14, 2015

(54) METHOD OF DETECTING BITMAP FAILURE ASSOCIATED WITH PHYSICAL COORDINATE

(71) Applicant: MACRONIX International Co., Ltd., Hsinchu (TW)

(72) Inventors: Tuung Luoh, Hsinchu (TW); Chi-Min Chen, Hsinchu (TW); Ling-Wuu Yang, Hsinchu (TW); Ta-Hone Yang, Hsinchu (TW); Kuang-Chao Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/220,993

(22) Filed: Mar. 20, 2014

(51) Int. Cl.
*H01L 21/00* (2006.01)
*G11C 99/00* (2006.01)
*H01L 21/66* (2006.01)
*G01R 31/28* (2006.01)

(52) U.S. Cl.
CPC ............ *H01L 22/14* (2013.01); *G01R 31/2851* (2013.01)

(58) Field of Classification Search
CPC ...... H01L 22/14; H01L 22/20; G01R 31/317; G01R 31/2851; G01R 31/2894
USPC .............................. 438/14, 16, 17; 702/59, 83
See application file for complete search history.

(56) References Cited

U.S. PATENT DOCUMENTS

2009/0206868 A1* 8/2009 Laisne et al. .................. 324/765
2013/0329508 A1* 12/2013 Ashburn et al. ............... 365/200

* cited by examiner

Primary Examiner — Evan Pert
(74) Attorney, Agent, or Firm — J. C. Patents

(57) ABSTRACT

A method of detecting bitmap failure associated with physical coordinates is provided. In the method, data of wafer mapping inspection are obtained first, and the data include images of defects in each of layers within a wafer and a plurality of physical coordinates of the defects. Thereafter, a bitmap failure detection is performed to obtain digital coordinates of failure bits within the wafer. The digital coordinates are converted into a plurality of physical locations, and the physical locations are overlapped with the physical coordinates so as to rapidly obtain correlations between the failure bits and the defects.

19 Claims, 6 Drawing Sheets

METHOD OF DETECTING BITMAP FAILURE ASSOCIATED WITH PHYSICAL COORDINATE

BACKGROUND OF THE INVENTION

1. Field of the Invention

The invention relates to a failure analysis methodology; more particular, the invention relates to a method of detecting bitmap failure associated with physical coordinates.

2. Description of Related Art

In the IC manufacturing process, the continuously decreasing line width requires precise control and monitor of relevant devices. Based on the semiconductor technology in the nanometer generation, the devices must be accurately inspected and analyzed in order to increase the yield of the devices.

The existing methods of performing failure analysis on chips include bitmap failure detection whereby failure bits may be obtained and physically located; what is more, according to the failure item, the actual layer having the failure within the chip may be predicted.

The cause of bitmap failure is often unclear. To clarify the cause, the chip should be polished from the surface thereof to the layer possibly having the failure, and a scanning electron microscope (SEM) surface analysis is then performed on the layer. As a result, the bitmap failure analysis is labor-intensive and time-consuming.

SUMMARY OF THE INVENTION

The invention is directed to a method of detecting bitmap failure associated with physical coordinates for significantly reducing time of analyzing failure bits.

The invention is further directed to a method of detecting bitmap failure associated with physical coordinates for rapidly learning physical locations and causes of failure bits.

In an embodiment of the invention, a method of detecting bitmap failure associated with physical coordinates includes: obtaining data of wafer mapping inspection. The data of wafer mapping inspection includes images of a plurality of defects in each of layers within a wafer and a plurality of physical coordinates of the defects within the wafer. In the method, a bitmap failure detection is performed to obtain digital coordinates of a plurality of failure bits within the wafer, and the digital coordinates are converted into a plurality of physical locations arranged in a line or polygon. The physical locations are overlapped with the physical coordinates within the wafer, so as to obtain correlations between the failure bits and the defects.

According to an embodiment of the invention, the method further includes obtaining scanning electron microscope (SEM) images of the defects according to the physical coordinates within the wafer, and the physical coordinates correspond to the physical locations of the failure bits. Based on the SEM images, causes of the failure bits are determined.

According to an embodiment of the invention, the step of overlapping the physical locations with the physical coordinates within the wafer includes: categorizing the failure bits according to the defects from the data of wafer mapping inspection.

In another embodiment of the invention, a method of detecting bitmap failure associated with physical coordinates includes: performing a bitmap failure detection to obtain digital coordinates of all of a plurality of failure bits within a wafer and converting the digital coordinates into a graphic data system (GDS) coordinate or an inspection result coordinate. Data of the GDS coordinate or data of the inspection result coordinate are compared with a database file of the wafer, so as to output a plurality of physical locations of the failure bits. The physical locations are compared with an inspection result file of the wafer to obtain a plurality of defects corresponding to the failure bits.

According to another embodiment of the invention, the method further includes categorizing the failure bits according to the obtained defects.

According to another embodiment of the invention, if the digital coordinates are converted into the inspection result coordinate, the step of comparing the Data with the database file is to match the inspection result coordinate with a defect Klarf map directly.

According to another embodiment of the invention, if the digital coordinates are converted into the GDS coordinate, before the step of comparing the Data with the database file, a defect Klarf map should be transferred into a coordinate of a GDS file.

According to the embodiments of the invention, the digital coordinates obtained by performing the bitmap failure detection include failure of a plurality of bit lines and failure of a plurality of word lines.

According to the embodiments of the invention, the failure of the bit lines or the failure of the word lines includes open, short, or close.

According to the embodiments of the invention, locations containing the defects include word lines, bit lines, polysilicon layers, or contacts.

According to the embodiments of the invention, the method further includes obtaining a source killing ratio (i.e., a defect-generation rate resulting in the failure bits) by comparing the number of the failure bits and the total number of the defects.

According to the embodiments of the invention, the method further includes: obtaining repeating systematic defects according to an inspection result of different dies within the wafer.

In view of the above, the result of analyzing hundreds or even thousands of failure bits may be obtained within a short period of time. Moreover, through the ratio of the number of the defects to the number of the failure bits, the source (layer) or defect category killing ratio of the word line failure may be obtained. Besides, as described herein, chip images are stored in a chip detection system; therefore, it is likely to obtain the images of locations containing the defects that lead to the failure bits, and the category to which the defects belong may be determined.

It is to be understood that both the foregoing general description and the following detailed description are exemplary, and are not intended to limit the scope of the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
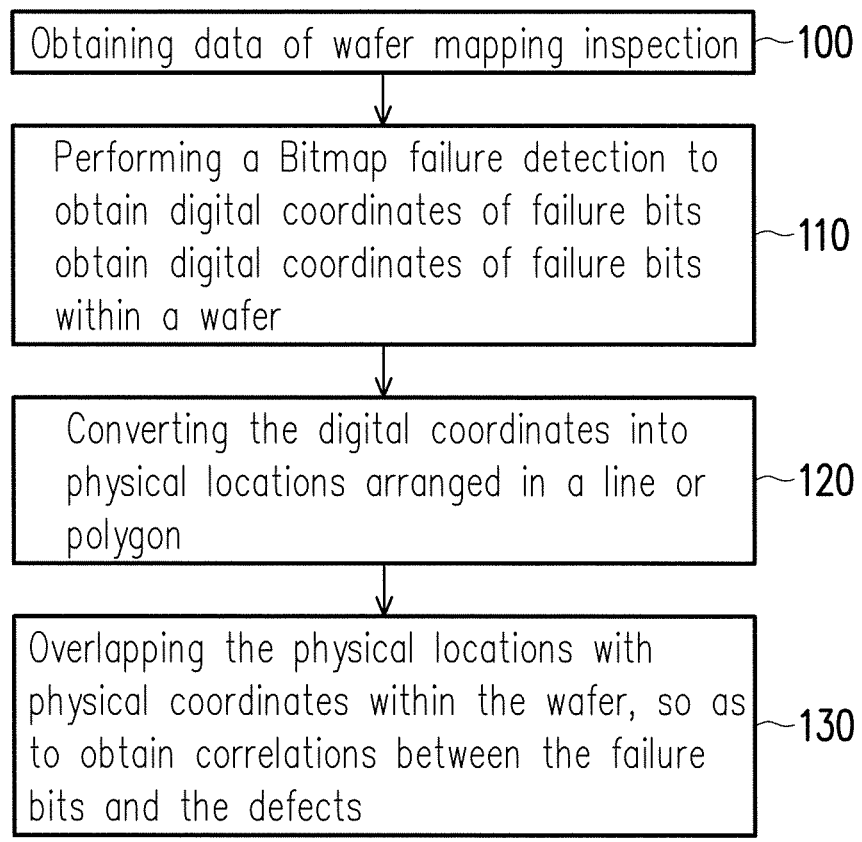
FIG. 1 is a diagram illustrating steps of detecting bitmap failure associated with physical coordinates according to a first embodiment of the invention.

FIG. 1 is a diagram illustrating steps of detecting bitmap failure associated with physical coordinates according to the first embodiment of the invention.

Figure 2:
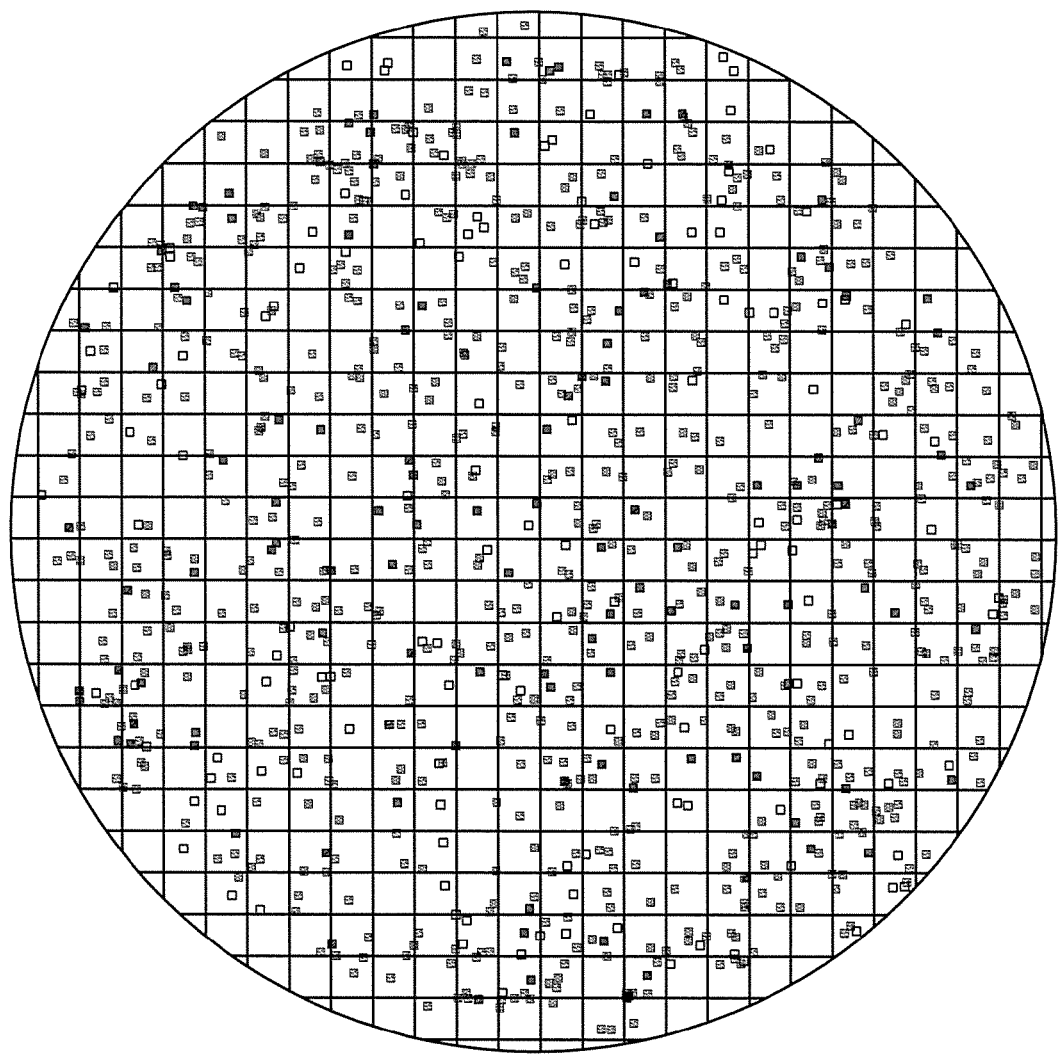
FIG. 2 illustrates a result of wafer mapping inspection according to the first embodiment of the invention.

With reference to FIG. 1, according to the present embodiment, step 100 is performed to obtain data of wafer mapping inspection. During the wafer mapping inspection, inspection machine is aligned to the actual wafer according to a wafer map, so as to obtain corresponding images. Thereby, each die in the wafer may be inspected immediately, and various defects in the dies may be numbered and marked by different colors on the wafer map, as shown in FIG. 2 (note that FIG. 2 in black and white is actually a color drawing). Said images are often obtained by means of a scanning electron microscope (SEM) and therefore can be stored and respectively named by the locations of the dies or the categories to which the defects belong. According to the present embodiment, the data of wafer mapping inspection includes images of defects in each layer within one single wafer and physical coordinates of the defects within the wafer. The locations containing the defects include word lines, bit lines, polysilicon layers, and contacts in the wafer.

In step 110, a bitmap failure detection is performed to obtain digital coordinates of failure bits within the wafer. In the bitmap failure detection, detection instruments are applied to detect failure bits and output the result in form of digital coordinates. The digital coordinates obtained in the bitmap failure detection may include different types of bit failure, such as failure of bit lines, failure of word lines, or failure caused by other lines. Besides, the failure of the bit lines or the failure of the word lines may be attributed to different reasons, e.g., open, short, close, etc.

In step 120, the digital coordinates are converted into a plurality of physical locations arranged in a line or polygon. In the bitmap failure detection, the obtained data are physical layout of the failure bits in form of GDSII coordinates; hence, through specific software in the detection instruments or other appropriate equipment, the digital coordinates are converted into files corresponding to the physical coordinates of the defects obtained by the wafer mapping inspection of step 100.

Figure 3A:
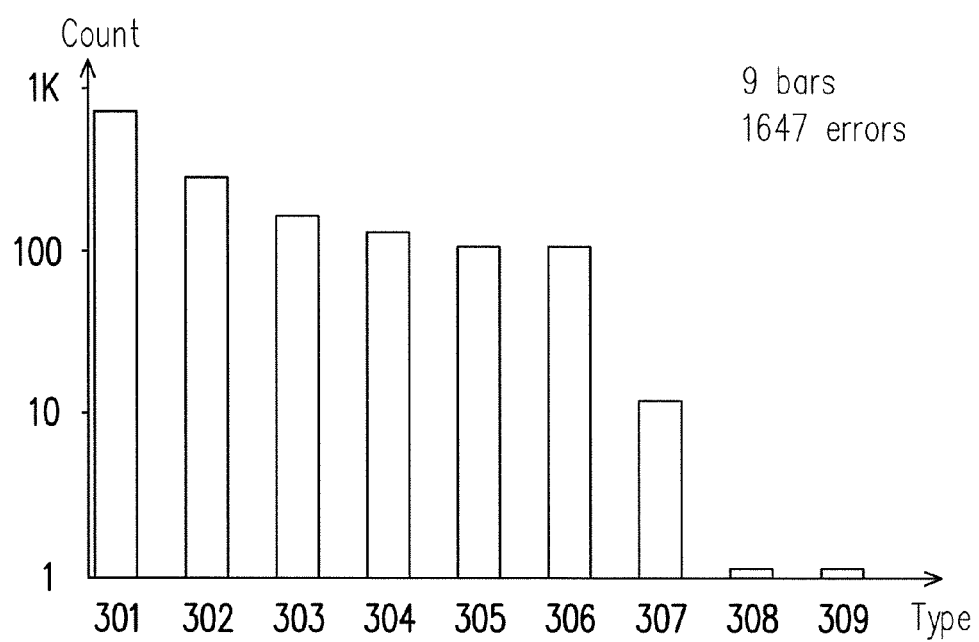
FIG. 3A is a bar diagram illustrating the failure bits categorized according to data of wafer mapping inspection in the first embodiment of the invention.
Figure 3B:
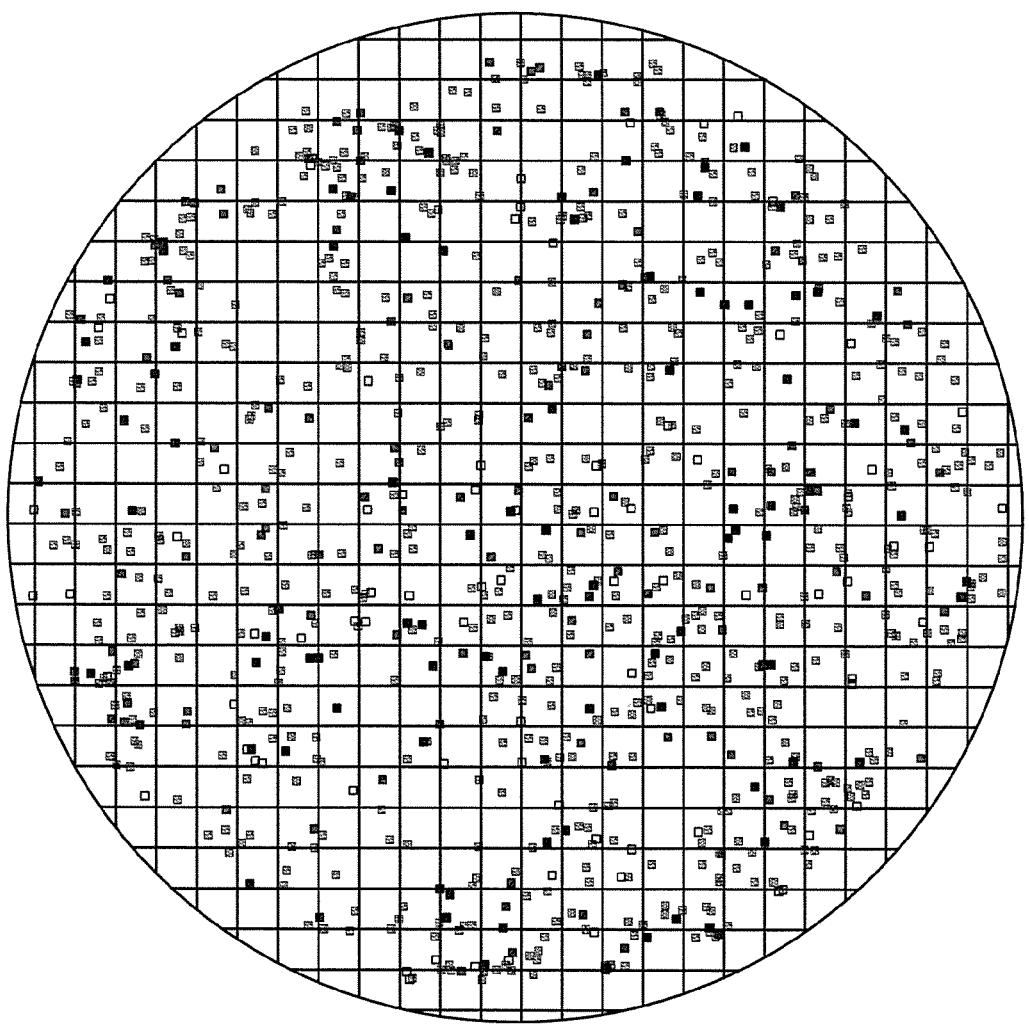
FIG. 3B is a wafer map derived from FIG. 3A.

In step 130, the physical locations are overlapped with the physical coordinates within the wafer, so as to obtain correlations between the failure bits and the defects. For instance, after step 130 is performed, data including defect IDs, x and y coordinates, categories to which the defect belong, the source layer, and the corresponding SEM images (if any) may be obtained. According to the different defects from the data of wafer mapping inspection, the failure bits may be further categorized in step 130 described herein. The bar diagram of FIG. 3A shows nine different categories 301 to 309 to which the defects belong and the corresponding number of defects. Here, the number of all defects is 1647. If the distribution of the different defects in the wafer is to be analyzed, certain software may be applied to obtain the wafer map shown in FIG. 3B (note that FIG. 3B in black and white is actually a color drawing).

The SEM image of each defect may be obtained according to the physical coordinates (corresponding to the physical locations of the failure bits) within the wafer, and causes of the failure bits may be determined according to the SEM images. Here, the SEM images are obtained during the wafer mapping inspection, and thus it is not necessary to perform additional steps for obtaining the SEM images of the defects. However, it is not limited herein. If only the physical coordinates within the wafer are corresponding to the physical locations of the failure bits, the positions of defects can be got, and thus the signature may be compared with failure bitmap.

According to the method provided in the first embodiment, a source killing ratio (i.e., a defect-generation rate resulting in the failure bits) may be obtained by comparing the number of the failure bits and the total number of the defects. That is, if the data of wafer mapping inspection obtained in step 100 indicate that the total number of the defects is m, and the number of defects corresponding to the failure bits and obtained in step 130 is n, the source killing ratio may be represented as n/m×100%.

In the first embodiment, the entire wafer is detected, and therefore repeating systematic defects may be obtained according to an inspection result of different dies within the wafer. For instance, if the permissible error is set to be 1 μm, the defects at the same location (±1 μm) in different dies are considered repeating defects.

Figure 4:
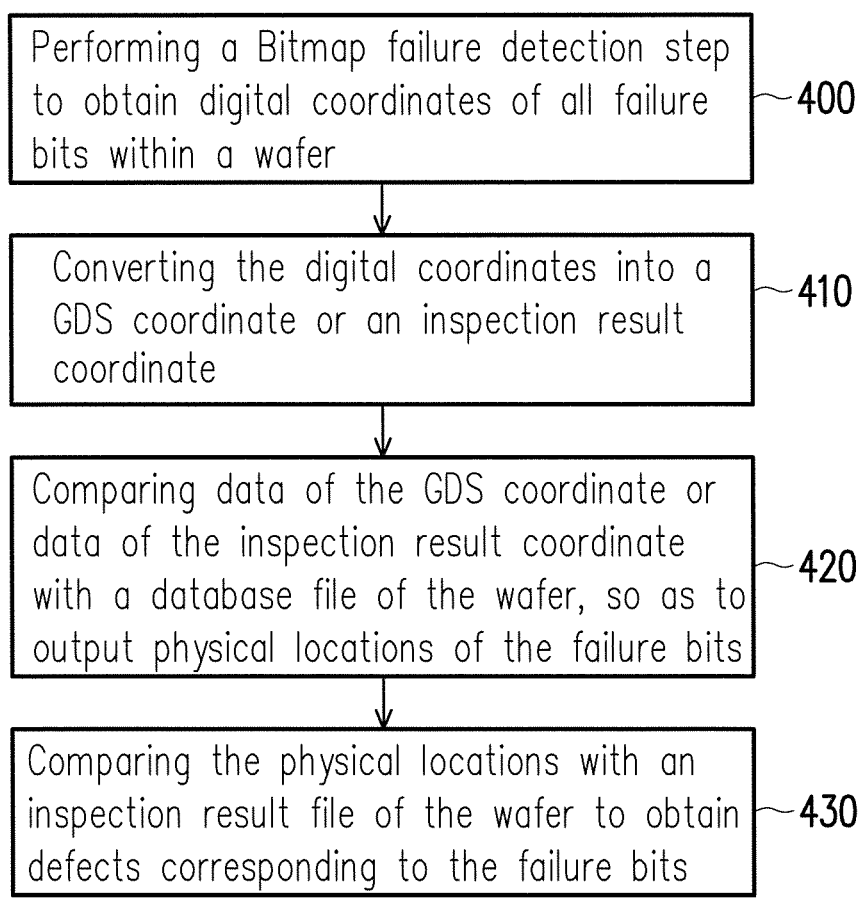
FIG. 4 is a diagram illustrating steps of detecting bitmap failure associated with physical coordinates according to a second embodiment of the invention.

FIG. 4 is a diagram illustrating steps of detecting bitmap failure associated with physical coordinates according to a second embodiment of the invention.

With reference to FIG. 4, in step 400, a bitmap failure detection is performed to obtain digital coordinates of all failure bits within a wafer. The digital coordinates obtained in the bitmap failure detection may include different types of bit failure, such as failure of bit lines, failure of word lines, or failure caused by other circuits. Besides, the failure of the bit lines or the failure of the word lines may be attributed to different reasons, e.g., open, short, close, etc.

In step 410, the digital coordinates are converted into a graphic data system (GDS) coordinate or an inspection result coordinate. The so-called GDS file is in most cases a file of a circuit layout design and thus includes the physical coordinates within the wafer. At present, the result obtained by the wafer inspection system may also be converted into the GDS coordinate by specific software. The inspection result coordinate refers to a result file (i.e., Klarf file) obtained by means of an inspection instrument manufactured by KLA Instruments Corp. In particular, the digital coordinates (e.g. bitmap coordinates) may be converted into physical GDS coordinate or Klarf coordinate.

In step 420, data of the GDS coordinate or data of the inspection result coordinate are compared with a database file of the wafer, so as to output physical locations of the failure bits. For example, if it is converted into the Klarf coordinate in the step 410, the Klarf coordinate is matched with a defect Klarf map directly. Alternatively, if it is converted into the GDS coordinate in the step 410, the defect Klarf map would be converted into another GDS coordinate before the step 420, and then the two GDS coordinates are compared with one another.

Figure 5:
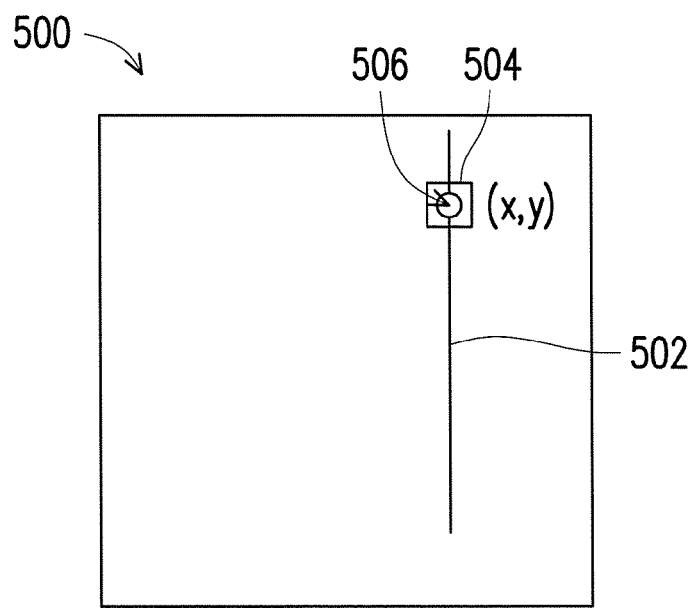
FIG. 5 is a schematic diagram illustrating a coordinate obtained according to the second embodiment.
Figure 6:
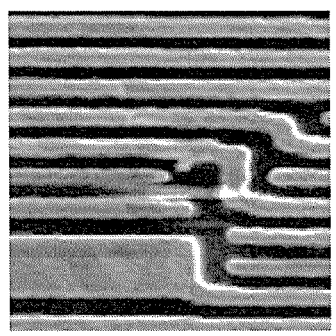
FIG. 6 is an SEM image of a location containing the defects depicted in FIG. 5.

In step 430, the physical locations are compared with the inspection result file of the wafer to obtain defects corresponding to the failure bits. FIG. 5 is a schematic diagram exemplarily illustrating a coordinate obtained after step 430 is performed. In FIG. 5, the straight line 502 in the coordinate diagram 500 refers to the physical location of the failure bit after the converted GDS file is obtained in step 410, and the region 504 represents the location of the defect 506 (obtained in step 403) corresponding to the failure bit. Although FIG. 5 merely shows one straight line 502 (i.e., one failure bit), one wafer may contain thousands or tens of thousands of failure bits, and therefore the invention should not be limited thereto. Besides, the so-called "inspection result file" includes data of wafer inspection obtained in each step (e.g., the wafer mapping step) of the manufacturing process of the wafer, and therefore the image of each layer of the wafer may be obtained. Hence, according to the coordinate of the region 504 shown in FIG. 5, the corresponding SEM image as shown in FIG. 6 may be obtained, and the cause of the failure bits may be determined according to the SEM image. If no defect is found in the SEM image of one layer as expected, defects may be found by observing the SEM image at the same location in other layers.

Besides, the failure bits may be categorized according to the obtained defects. For instance, the locations containing the defects may be the word lines, the bit lines, the polysilicon layers, the contacts, or at least two of the above, the detected failure bits may be categorized into (1) the failure bits derived from the defects of the word lines, (2) the failure bits derived from the defects of the bit lines, (3) the failure bits derived from the defects of the polysilicon layers (e.g., gate structures), (4) the failure bits derived from the defects of the contacts, and so on.

Additionally, in the second embodiment, a source killing ratio (i.e., a defect-generation rate resulting in the failure bits) may be obtained by comparing the number of the failure bits and the total number of the defects. According to the second embodiment, repeating systematic defects may also be obtained by virtue of an inspection result of different die ID within the wafer.

To sum up, as described herein, the result of analyzing hundreds or even thousands of failure bits may be obtained within a short period of time. In addition, since the precise locations of the defects corresponding to the failure bits may be obtained, the failure bits may be easily detected, and the causes of the failure bits may be learned with ease. Moreover, through the ratio of the number of the defects to the number of the failure bits, the source (layer) killing ratio of the word line failure may be obtained. Besides, as described herein, chip images are stored in a chip detection system; therefore, it is likely to obtain the images of locations containing the defects that lead to the failure bits. Last but not least, repeating systematic defects may be obtained according to the method provided herein.

Although the invention has been described with reference to the above exemplary embodiments, it will be apparent to one of ordinary skill in the art that modifications to the described exemplary embodiments may be made without departing from the spirit of the invention. Accordingly, the scope of the invention will be defined by the attached claims and not by the above detailed descriptions.

What is claimed is:

1. A method of detecting bitmap failure associated with physical coordinates, the method comprising:
    obtaining data of wafer mapping inspection, the data of wafer mapping inspection comprising images of a plurality of defects in each of layers within a wafer and a plurality of physical coordinates of the defects within the wafer;
    performing a bitmap failure detection to obtain digital coordinates of a plurality of failure bits within the wafer;
    converting the digital coordinates into a plurality of physical locations arranged in a line or polygon; and
    overlapping the physical locations with the physical coordinates within the wafer so as to obtain correlations between the failure bits and the defects.

2. The method as recited in claim 1, further comprising:
    obtaining SEM images of the defects according to the physical coordinates within the wafer, the physical coordinates corresponding to the physical locations of the failure bits; and
    determining causes of the failure bits according to the SEM images.

3. The method as recited in claim 1, wherein the step of overlapping the physical locations with the physical coordinates within the wafer comprises: categorizing the failure bits according to the defects from the data of wafer mapping inspection.

4. The method as recited in claim 1, wherein the digital coordinates obtained by performing the bitmap failure detection comprise failure of a plurality of bit lines and failure of a plurality of word lines.

5. The method as recited in claim 4, wherein the failure of the bit lines comprises open, short, or close.

6. The method as recited in claim 4, wherein the failure of the word lines comprises open, short, or close.

7. The method as recited in claim 1, wherein locations containing the defects comprise word lines, bit lines, polysilicon layers, or contacts.

8. The method as recited in claim 1, further comprising obtaining a source killing ratio by comparing a number of the failure bits and a total number of the defects.

9. The method as recited in claim 1, further comprising obtaining repeating systematic defects according to an inspection result of different dies within the wafer.

10. A method of detecting bitmap failure associated with physical coordinates, the method comprising:
    performing a bitmap failure detection to obtain digital coordinates of all of a plurality of failure bits within a wafer;
    converting the digital coordinates into a graphic data system (GDS) coordinate or an inspection result coordinate;
    comparing data of the GDS coordinate or data of the inspection result coordinate with a database file of the wafer, so as to output a plurality of physical locations of the failure bits; and
    comparing the physical locations with an inspection result file of the wafer to obtain a plurality of defects corresponding to the failure bits.

11. The method as recited in claim 10, further comprising categorizing the failure bits according to the defects.

12. The method as recited in claim 10, wherein the step of comparing the data with the database file comprises directly matching the inspection result coordinate with a defect Klarf map if the digital coordinates are converted into the inspection result coordinate.

13. The method as recited in claim 10, wherein before the step of comparing the data with the database file, further comprises transferring a defect Klarf map into a GDS file if the digital coordinates are converted into the GDS coordinate.

14. The method as recited in claim 10, wherein the digital coordinates obtained by performing the bitmap failure detection comprise failure of a plurality of bit lines and failure of a plurality of word lines.

15. The method as recited in claim 14, wherein the failure of the bit lines comprises open, short, or close.

16. The method as recited in claim 14, wherein the failure of the word lines comprises open, short, or close.

17. The method as recited in claim 10, wherein locations containing the defects comprise word lines, bit lines, polysilicon layers, or contacts.

18. The method as recited in claim 10, further comprising obtaining a source killing ratio by comparing a number of the failure bits and a total number of the defects.

19. The method as recited in claim 10, further comprising obtaining repeating systematic defects according to an inspection result of different dies within the wafer.

* * * * *